United States Patent
Baniecki et al.

(10) Patent No.: US 7,161,200 B2
(45) Date of Patent: Jan. 9, 2007

(54) CAPACITIVE ELEMENT AND METHOD OF MANUFACTURING THE SAME

(75) Inventors: John David Baniecki, Kawasaki (JP); Kenji Nomura, Kawasaki (JP); Takeshi Shioga, Kawasaki (JP); Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 60 days.

(21) Appl. No.: 11/014,810

(22) Filed: Dec. 20, 2004

(65) Prior Publication Data

US 2006/0051917 A1 Mar. 9, 2006

(30) Foreign Application Priority Data

Sep. 3, 2004 (JP) .............................. 2004-256662

(51) Int. Cl.
*H01L 29/76* (2006.01)
*H01L 29/94* (2006.01)
*H01L 31/062* (2006.01)
*H01L 31/113* (2006.01)

(52) U.S. Cl. ........................... 257/295; 438/3; 438/257

(58) Field of Classification Search ................ 257/295, 257/300, 306, 308, 310; 438/3, 250, 257, 438/261
See application file for complete search history.

(56) References Cited

U.S. PATENT DOCUMENTS 4,392,180 A * 7/1983 Nair ........................... 361/321
5,081,070 A * 1/1992 Yokoyama et al. ............. 505/1

FOREIGN PATENT DOCUMENTS

| JP | 2681214 | 8/1997 |
| JP | 10-27886 | 1/1998 |
| JP | 10-506228 | 6/1998 |
| JP | 2878986 | 1/1999 |
| JP | 11-233305 | 8/1999 |
| JP | 2002-537627 | 11/2002 |

* cited by examiner

*Primary Examiner*—Phuc T. Dang
(74) *Attorney, Agent, or Firm*—Westerman, Hattori, Daniels & Adrian, LLP.

(57) ABSTRACT

A capacitive element which includes: a silicon substrate (base material) 1; a base insulating film 2 formed on the silicon substrate 1; and a capacitor Q constituted by forming a bottom electrode 4a, a capacitor dielectric film 5a and a top electrode 6a on the base insulating film 2. The capacitive element is characterized in that the capacitor dielectric film 5a is composed of a material with the formula $(Ba_{1-y}Sr_y)_m Y_p Ti_Q O_{3+\delta}$, where $0 < p/(p+m+Q) \leq 0.015$, $-0.5 < \delta < 0.5$.

27 Claims, 16 Drawing Sheets

CAPACITIVE ELEMENT AND METHOD OF MANUFACTURING THE SAME

CROSS-REFERENCE TO RELATED APPLICATIONS

This application is based on and claims priority of Japanese Patent Application No. 2004-256662 filed on Sep. 3, 2004, the entire contents of which are incorporated herein by reference.

BACKGROUND OF THE INVENTION

1. Field of the Invention

The present invention relates to a capacitive element and a method of manufacturing the same.

2. Description of the Related Art

Currently, $ABO_3$ perovskite type dielectric materials such as BST "$(Ba,Sr)TiO_3$" have been studied for their applications to tunable capacitive elements in microwave and RF devices, and further to decoupling capacitors and DRAM (Dynamic Random Access Memory). For these applications, a high tunability of capacitance $\Delta C(V)$ or high capacitance density is required for dielectric materials. It is noted that the tunability of capacitance $\Delta C(V)$ can be defined as $\Delta C(V) = 100 \times (C_{max} - C_{min})/C_{min}$. Here, $C_{max}$ and $C_{min}$ are the maximum capacitance density and the minimum capacitance density over the operating voltage, respectively.

Incidentally, in order to apply a polycrystalline film with high dielectric constant such as BST to tunable capacitive elements and to elements requiring high dielectric materials, the tunability of capacitance and the permittivity thereof need to be increased while suppressing the leak current and dielectric loss of the dielectric materials.

Enhancement of the crystallinity of high dielectric constant film and optimization of its in-plane strain are considered to be important factors in order to achieve the above-described requirement.

Among these factors, the film crystallinity becomes appropriate by increasing the temperature at which the high dielectric constant film is deposited. However, in some cases, adopting a high deposition temperature results in increasing the leak current and dielectric loss of the high dielectric constant film. Moreover, titanium perovskite type dielectric materials expand greatly due to heat. For this reason, if the deposition temperature is increased, large tensile stress associated with the thermal expansion is generated in the high dielectric constant film deposited on substrates with mismatched thermal coefficients of expansion with the film. However, this leads to mismatch of lattice parameters between a base such as silicon and the high dielectric constant film, causing the problem that the electric property of the high dielectric constant film as well as the adhesion property of the film to the base are deteriorated.

Meanwhile, the in-plane strain of the film can be controlled by forming the high dielectric constant film so that the lattice parameter thereof matches with that of the base.

However, this severely restricts the kinds of bases available.

For this reason, a capacitive element having reduced in-plane strain, higher capacitance density, improved tunability of capacitance and excellent film adhesion property is demanded.

Incidentally, the leak current and reliability are improved even when amphoteric dopants are used as substitutes for either of the A-site ions or the B-site ions of the $ABO_3$ perovskite type dielectric material. For example, Patent Document 1 discloses that Y (yttrium) is doped in BST film as shown in its FIG. 9.

However, according to the results shown in FIG. 9 of the Patent Document 1, as the doping amount of Y increases, the permittivity of the sample having a temperature of 800° C. starts to decline after showing slight increase, and the permittivity of the sample having a temperature of 750° C. shows monotonous decrease. In any samples, the permittivity is globally reduced, which is unfavorable.

Furthermore, in Patent Document 2, BST having specific composition, for example, $(Ba_{0.85}, Sr_{0.15})TiO_3$ is epitaxially grown on a Pt layer. In this way, the lattice parameter of the BST is set greater than that of the Pt, and the stress of the film is intentionally induced. This technique is supposed to provide the advantage that residual dielectric polarization is increased.

However, since the method employed in Patent Document 2 utilizes mismatch of the lattice parameters between a dielectric layer such as BST and the base, the kinds of available bases are inconveniently restricted. In addition, the BST needs to be grown epitaxially in order to utilize mismatch of the lattice parameters, so that the aforementioned advantage cannot be obtained by using other deposition methods than this method, which restricts the available method of depositing dielectric films.

Patent Documents 3 to 5 disclose other techniques relating to the present invention.

(Patent Document 1) Translated National Publication Paten Application No. Hei10-506228

(Patent Document 2) Japanese Patent NO. 2878986

(Patent Document 3) Translated National Publication Paten Application No. 2002-537627

(Patent Document 4) Japanese Patent Laid-Open NO. Hei10-27886

(Patent Document 5) Japanese Patent NO. 2681214

SUMMARY OF THE INVENTION

According to one aspect of the present invention, provided is a capacitive element which includes: a base material; an insulating film formed on the base material; and a capacitor constituted by sequentially forming a bottom electrode, a capacitor dielectric film and a top electrode on the insulating film. The capacitive element is characterized in that the capacitor dielectric film is composed of a material with the formula $(Ba_{1-y}Sr_y)_m Y_p Ti_Q O_{3+\delta}$, where $0 < p/(p+m+Q) \leq 0.015$, $-0.5 < \delta < 0.5$.

According to another aspect of the present invention, provided is a method of manufacturing a capacitive element. The method includes: a step of forming an insulating film on a base material; a step of forming a first conductive film on the insulating film; a step of forming a dielectric film composed of a material with the formula $(Ba_{1-y}Sr_y)_m Y_p Ti_Q O_{3+\delta}$, where $0 < p/(p+m+Q) \leq 0.015$, $-0.5 < \delta < 0.5$, on the first conductive film; a step of forming a second conductive film on the dielectric film; and a step of forming a capacitor constituted of a bottom electrode, a capacitor dielectric film and a top electrode, by patterning the first conductive film, the dielectric film and the second conductive film.

According to the results of the experiments performed by the inventor of the present invention, it was revealed that, by setting $p/(p+m+Q)$, which represents the ratio of the number of Y atoms to the total number of atoms, to satisfy $0 < p/(p+m+Q) < 0.015$ for the composition $(Ba_{1-y}Sr_y)_m Y_p Ti_Q O_{3+\delta}$ as described above, reduction in in-plane strain, increase in relative permittivity and reduction in leak current can be all achieved at the same time for capacitor dielectric films, and that reliability of the capacitor can be enhanced as compared to capacitor dielectric films in which Y is not doped.

Moreover, in the present invention, it is only necessary to set $p/(p+m+Q)$ to satisfy $0<p/(p+m+Q)\leq 0.015$. Accordingly, the method for depositing capacitor dielectric films is not limited to epitaxial growth as in Patent Document 2, and non-epitaxial growth methods using deposition methods such as sputtering method, sol-gel method and the like can also be employed to deposit dielectric films. Thus, it is possible to increase flexibility in selecting available processes as compared to the method of Patent Document 2.

Furthermore, the permittivity can be effectively increased by setting the composition of the capacitor dielectric film to satisfy $0.85<m/(p+Q)$.

The permittivity can also be increased by setting the composition of the capacitor dielectric film to satisfy $0.9<Q/m<1$.

In addition, the composition $(Ba_{1-y},Sr_y)_m Y_p Ti_Q O_{3+\delta}$ having the aforementioned atomic ratio is also characterized in that the in-plane strain thereof is less than 0.005.

Alternatively, the composition $(Ba_{1-y},Sr_y)_m Y_p Ti_Q O_{3+\delta}$ is also characterized in that the in-plane strain thereof is reduced more than 10% as compared to the composition in which Y is not doped.

By doping divalent or trivalent cation to this composition $(Ba_{1-y},Sr_y)_m Y_p Ti_Q O_{3+\delta}$, the relative permittivity of the capacitor dielectric film can be increased by 60% or above as compared to the capacitor film in which these cations are not doped.

DETAILED DESCRIPTION OF THE PREFERRED EMBODIMENTS

Hereinafter, preferred embodiments for carrying out the present invention will be described in detail with reference to the accompanying drawings.

(1) First Embodiment

FIG. 1A to FIG. 1E are cross-sectional views each showing a capacitive element according to a first embodiment of the present invention in course of manufacture.

Figure 1A:
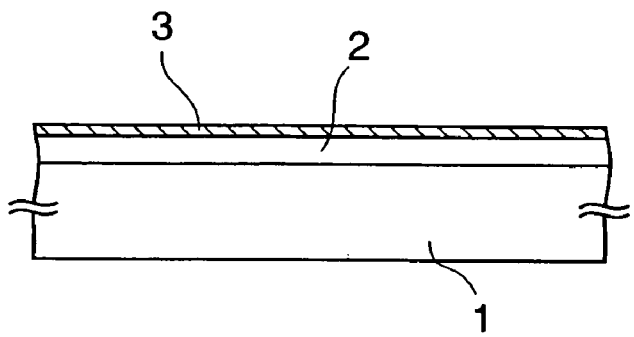
FIG. 1A to FIG. 1E are cross-sectional views each showing a capacitive element according to a first embodiment of the present invention in course of manufacture.

First, a description will be given for processes through which the cross-sectional structure of the capacitive element shown in FIG. 1A is obtained.

First, using CVD (Chemical Vapor Deposition) method, a silicon oxide ($SiO_2$) film having a thickness of about 500 nm is formed as an underlying insulating film 2 on a base material 1 such as a silicon substrate. It should be noted that the base material 1 is not limited to the silicon substrate. A single crystal semiconductor substrate made of any one of silicon, germanium, silicon-germanium (SiGe), gallium arsenide (GaAs), indium arsenide (InAs) and indium phosphide (InP) may be employed for the base material. In addition, the underlying insulating film 2 is not limited to the silicon oxide film. Any one of the silicon oxide film, a silicon nitride ($SiN_4$) film, a silicon oxide-nitride (SiON) film, a metal-oxide film with high dielectric constant and a xerogel film, or a composite film obtained by combining two or more of these films can be formed as the underlying insulating film 2.

Subsequently, using sputtering method, titanium oxide ($TiO_2$) having a thickness of about 20 nm is formed. The formed film is used as an adhesion layer 3. The adhesion layer 3 is not limited to titanium oxide. For example, a monolayer film or a laminated film, each of which is composed of any one of platinum, iridium, zirconium, titanium, titanium oxide, iridium oxide, platinum oxide, zirconium oxide, titanium nitride, titanium aluminum nitride (TiAlN), tantalum nitride, tantalum silicon nitride (TaSiN) and an alloy of any of these materials can be employed as the adhesion layer 3.

Figure 1B:
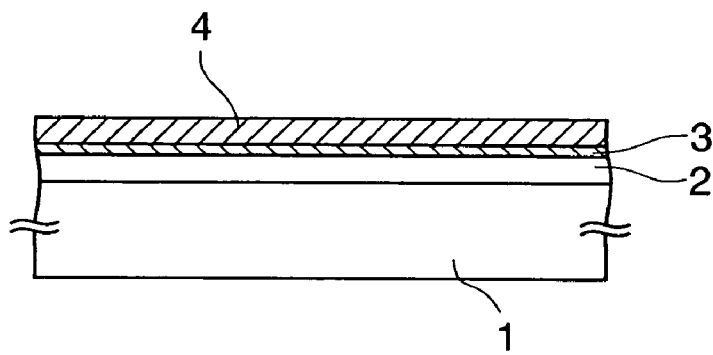

Next, a platinum (Pt) film having a thickness of about 80 nm is formed as a first conductive film 4 using sputtering method as shown in FIG. 1B. The first conductive film 4 is increased in its adhesion strength to the base material 1 by means of the adhesion layer 3. Accordingly, the first conductive film 4 never peels off in course of manufacture. The first conductive film 4 is not limited to the platinum film. A monolayer film or a laminated film, each of which is composed of any one of platinum, palladium, iridium, ruthenium, rhodium, osmium, gold, silver, copper, platinum oxide, iridium oxide, ruthenium oxide and an alloy of any of these materials, may constitute the first conductive film 4.

Figure 1C:
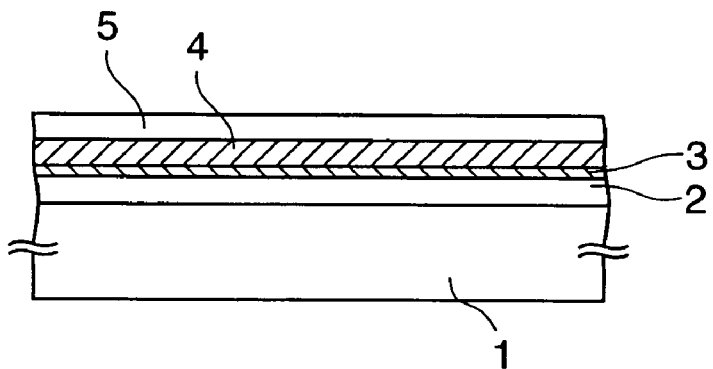

Next, a description will be given for processes through which the cross-sectional structure of the capacitive element shown in FIG. 1C is obtained.

First, the substrate 1 is loaded on the stage located inside an sputter chamber for RF sputtering (not shown), the sputter chamber being provided with a sputter target formed of $(Ba_{0.63}Sr_{0.37})_{1.015}Y_{0.026}Ti_{0.960}O_3$ sintered body. The substrate temperature is stabilized at around 520° C. Thereafter, Ar+O$_2$ gas is introduced inside the chamber as a sputter gas and the pressure inside the chamber is stabilized at around 1.25 Pa. At this point, sputtering for composition $(Ba_{0.63}Sr_{0.37})_{1.015}Y_{0.026}Ti_{0.960}O_3$ is started by applying RF (radiofrequency) electric power having the frequency of 13.56 MHz and electric power of 100 W between the stage and the target. This state is then maintained for a predetermined period. Sputtering is stopped at the point where the $(Ba_{0.63}Sr_{0.37})_{1.015}Y_{0.026}Ti_{0.960}O_3$ film having the thickness of about 1 to 10000 nm is formed on the first conductive film 4, and the formed film is used as a dielectric film 5.

In order to enhance crystallinity of the film 5, the dielectric film 5 is then subject to annealing in an oxygen-containing atmosphere and under the condition of the substrate temperature of about 100 to 900° C.

Here, cations such as $Fe^{+3}$ and $Al^{+3}$ may be doped in the aforementioned composition $(Ba_{0.63}Sr_{0.37})_{1.015}Y_{0.026}Ti_{0.960}O_3$ to form composition $(Ba_{1-x}Sr_x)(Fe,Al)_e Y_z Ti_{1-z-p}O_3$. Then, this composition $(Ba_{1-x}Sr_x)(Fe,Al)_e Y_z Ti_{1-z-p}O_3$ may be used to constitute the dielectric film 5. Moreover, cations to be doped are not limited to $Fe^{+3}$ and $Al^{+3}$, and divalent or trivalent cation with ionic radius of 0.6 Å to 1 Å may be doped. Examples for such cations include aluminum ion, iron ion, manganese ion, nickel ion, cobalt ion, magnesium ion, lutetium ion, erbium ion, yttrium ion, holmium ion, dysprosium ion, gadolinium ion, thulium ion and scandium ion.

It has been revealed that, by doping these cations to the dielectric film 5, the relative permittivity of the dielectric film can be increased by 60% or above as compared to the dielectric film in which these cations are not doped.

However, these cations may not be doped when such a high permittivity is not required.

In addition, the relative number of oxygen atoms in the formula $(Ba_{0.63}Sr_{0.37})_{1.015}Y_{0.026}Ti_{0.960}O_3$ is not limited to 3. The relative number thereof may vary between $3+\delta$ ($-0.5<\delta<0.5$).

Method for depositing the dielectric film 5 is not limited to sputtering method. CVD method, sol-gel method or the like may be used to form the dielectric film 5.

Figure 1D:
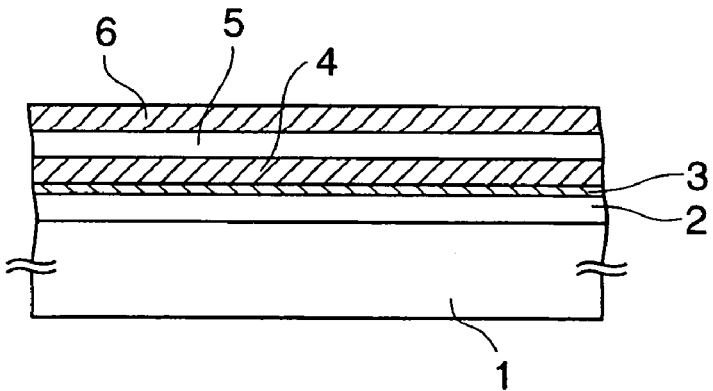

Next, as shown in FIG. 1D, an iridium oxide ($IrO_2$) film having a thickness of about 100 nm is formed using sputtering method, and the $IrO_2$ film is used as a second conductive film 6. Here, the second conductive film 6 is not limited to the iridium oxide film. For example, a monolayer film or a laminated film, each of which is composed of any one of platinum, palladium, iridium, ruthenium, rhodium, osmium, gold, silver, copper, platinum oxide, iridium oxide, ruthenium oxide, strontium ruthenium oxide ($SrRuO_3$) and lanthanum nickel oxide ($LaNiO_3$), and an alloy of any of these materials, may be formed as the second conductive film 6.

Figure 1E:
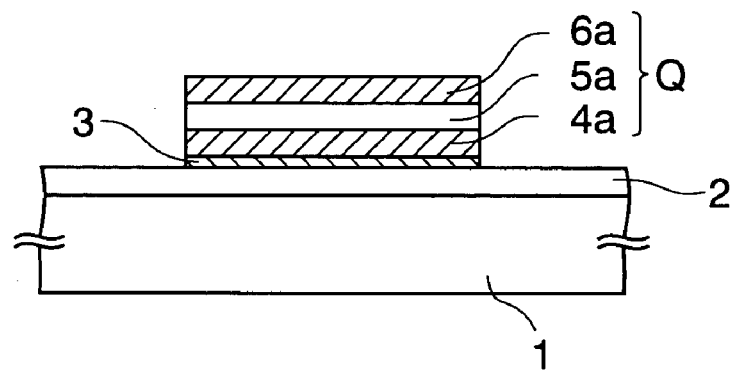

Thereafter, as shown in FIG. 1E, the first conductive film 4, the dielectric film 5 and the second conductive film 6 are patterned through photolithography process to form a bottom electrode 4a, a capacitor dielectric film 5a and a top electrode 6a, respectively, thereby constituting a capacitor Q. In this photolithography process, the adhesion layer 3 is also patterned. Thus, the adhesion layer 3 is only left beneath the bottom electrode 4a. Here, the order in which the films 4 to 6 are patterned is not limited. They may be etched by a single etching operation using a piece of resist pattern. Alternatively, etching may be performed for each of the films 4 to 6 using different resist patterns.

As described above, in the present embodiment, the $(Ba_{0.63}Sr_{0.37})_{1.015}Y_{0.026}Ti_{0.960}O_3$ film in which Y (yttrium) is doped so that the percentage of the ratio of the number of Y atoms to the total number of atoms becomes specific value, i.e., 1.3% is formed as the dielectric film 5. The dielectric film 5 is subsequently patterned to form the capacitor dielectric film 5a. As used herein, the atomic ratio is defined by the following formula 1 when the chemical formula of the dielectric material, except for oxygen, is expressed in the form of $M_{C1}M_{C2} \ldots M_{CN}$:

$$\left( \begin{array}{c} \text{The ratio of the number of } i\text{-th} \\ \text{ion atoms to the total number of atoms} \end{array} \right) = \frac{C_i}{\sum_{i=1}^{N} c_i} \quad \text{[Formula 1]}$$

The inventor of the present invention investigated how physical properties of the dielectric film 5 change when such an atomic ratio is employed.

The following Table 1 was obtained by employing the $(Ba_{0.63}Sr_{0.37})(Fe,Al)_{0.001}Ti_{0.998}O_3$ film, in which Y is not doped, as a comparative example and calculating the respective in-plane strains of the comparative example and the dielectric film 5.

The in-plane strain $x_m$ in the present embodiment is defined as $(d_{sm}-d_{um})/d_{um}$, where $d_{sm}$ is the lattice parameter of the strained $(Ba_{0.63}Sr_{0.37})_{1.015}Y_{0.026}Ti_{0.960}O_3$ film and $d_{um}$ is the lattice parameter of the unstrained $(Ba_{0.63}Sr_{0.37})_{1.015}Y_{0.026}Ti_{0.960}O_3$ film. The strained lattice parameter is also referred to as "in-plane lattice parameter" in some cases. These lattice parameters $d_{sm}$ and $d_{um}$ were investigated with XRD (X-Ray Diffraction) using d(lattice parameter) versus sin $2\chi$(diffraction angle) analysis.

In addition, the in-plane strain $x_0$ in the comparative example is defined as $(d_{s0}-d_{u0})/d_{u0}$, where $d_{s0}$ is the lattice parameter of the strained $(Ba_{0.63}Sr_{0.37})(Fe,Al)_{0.001}Ti_{0.998}O_3$ film and $d_{u0}$ is lattice parameter of the unstrained $(Ba_{0.63}Sr_{0.37})(Fe,Al)_{0.001}Ti_{0.998}O_3$ film.

TABLE 1

| | comparative example $(Ba_{0.63}Sr_{0.37})(Fe,Al)_{0.001}Ti_{0.998}O_3$ | present embodiment $(Ba_{0.63}Sr_{0.37})_{1.015}Y_{0.026}Ti_{0.960}O_3$ | ratio |
|---|---|---|---|
| The ratio of the number of Y atoms to the total number of atoms (percentage) | 0% | 1.3% | −0.19147 |
| lattice parameter with in-plane strain | $d_{s0} = 4.02611$ | $ds_m = 4.03217$ | |
| lattice parameter without in-plane strain | $d_{u0} = 4.00468017$ | $d_{um} = 4.01480075$ | |
| in-plane strain | 0.005350187 | 0.004325805 | |

As can be seen from Table 1, the $(Ba_{0.63}Sr_{0.37})_{1.015}Y_{0.026}Ti_{0.960}O_3$ film of the present embodiment, in which Y is doped so that the percentage of the ratio of the number of Y atoms to the total number of atoms becomes 1.3%, shows about 20% reduction (=100× $(x_0−x_m)/x_0$) in the in-plane strain compared to the $(Ba_{0.63}Sr_{0.37})(Fe,Al)_{0.001}Ti_{0.998}O_3$ film of the comparative example. Thus, it can be appreciated that Y, the ratio of which to the total number of atoms is 1.3%, is effective in reducing the in-plane strain.

The in-plane strain $x_0$ in the $(Ba_{0.63}Sr_{0.37})(Fe,Al)_{0.001}Ti_{0.998}O_3$ film of the comparative example is 0.00535, and the in-plane strain $x_m$ in the $(Ba_{0.63}Sr_{0.37})_{1.015}Y_{0.026}Ti_{0.960}O_3$ film of the present embodiment is 0.00432. Accordingly, the dielectric film 5, which is doped with Y and reduced in the in-plane strain, can also be characterized in that the in-plane strain thereof is less than 0.005.

Alternatively, the above-described dielectric film 5 can also be characterized in that the reduction ratio of the in-plane strain to that in the comparative example (=100X $(x_0−x_m)/x_0$) is greater than 10%.

The following Table 2 was obtained by varying the ratio of the number of Y atoms to the total number of atoms in the $(Ba_{0.63}Sr_{0.37})_{1.015}Y_{0.026}Ti_{0.960}O_3$ film according to the present embodiment and investigating how in-plane strains thereof change.

as $Ba_{1−y}Sr_y)_{1−x}Y_{x+z}Ti_{1−z}O_{3+\delta}$, the in-plane strain of the dielectric film 5 can be effectively reduced if $(X+Z)/2$, the ratio of the number of Y atoms to the total number of atoms, satisfies $0<(X+Z)/2 \leq 0.015$ (i.e. $0<(X+Z)\leq 0.03$).

However, in some cases, the dielectric film 5 does not become stoichiometric because of grain boundary segregation and other phases formed along grain boundaries. In this case, the ratio of the number of Y atoms to the total number of atoms is expressed as $p/(p+m+Q)$ when the composition of the dielectric film 5 is expressed as $(Ba_{1−y}Sr_y)_m Y_p Ti_Q O_{3+\delta}$. Thus, in this case, the in-plane strain of the dielectric film 5 is effectively reduced when $0<p/(p+m+Q)\leq 0.015$ is satisfied.

Meanwhile, the relative permittivity of the dielectric film is known to change depending on voltages applied from both the top and bottom sides of the film. In this connection, the inventor of the present invention varied the ratios of the number of Y atoms to the total number of atoms "$(x+z)/2$" in the $(Ba_{0.63},Sr_{0.37})_{1−x}Y_{x+z}Ti_{1−z}O_{3+\delta}$ film having the thickness of 70 nm. The inventor of the present invention then investigated how voltage dependency of the relative permittivity of the film changes depending on the ratio of the number of Y atoms to the total number of atoms. The results thereof are shown in FIG. 2.

Figure 2:
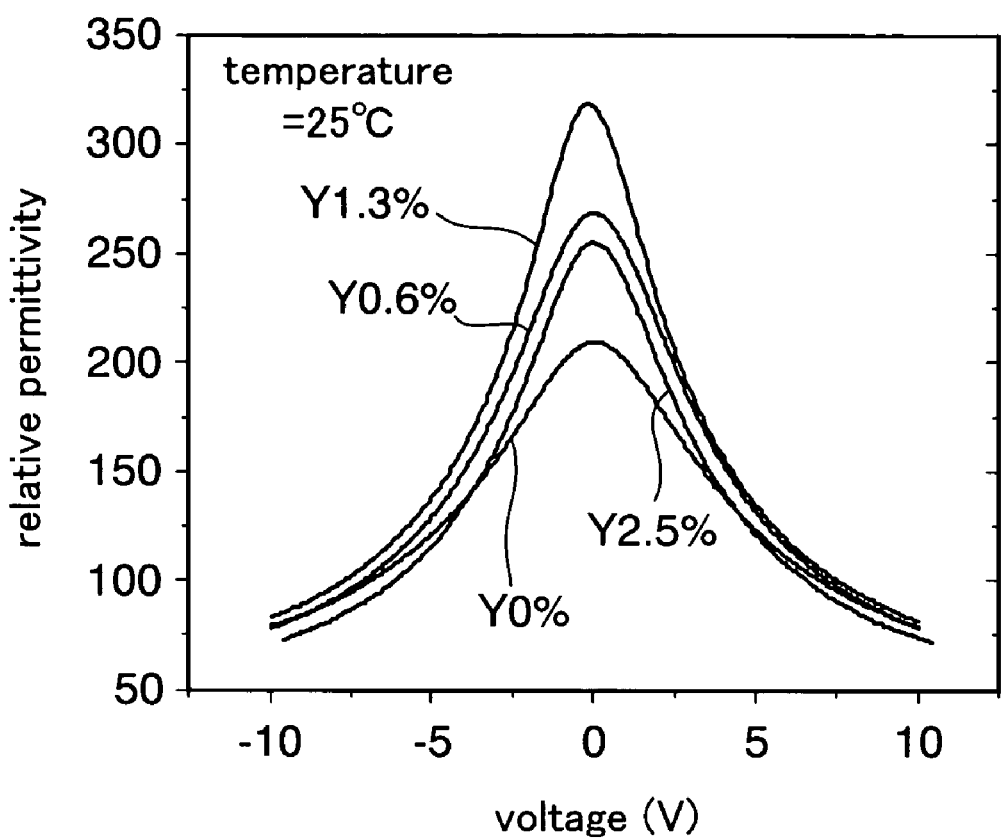
FIG. 2 is a graph obtained by setting a variety of the ratios of the number of Y atoms to the total number of atoms in the $(Ba_{0.63},Sr_{0.37})_{1-x} Y_{x+z} Ti_{1-z} O_3$ film and investigating how voltage dependency of the relative permittivity of the film changes depending on the ratio of the number of Y atoms to the total number of atoms in the first embodiment of the present invention.

As shown in FIG. 2, the film in which Y is not doped (0%) shows the lowest relative permittivity. The relative permittivity increases as the percentage of the ratio of the number

TABLE 2

| The ratio of the number of Y atoms to the total number of atoms (percentage) | in-plane lattice parameter: $d_s$ | out-of-plane lattice parameter | lattice parameter without stress: $d_u$ | in-plane strain: $100 \times (d_s − d_u)/d_u$ |
|---|---|---|---|---|
| 0 | 4.034260000 | 3.994950000 | 4.014204038 | 0.4996249 |
| 0.6% | 4.032490145 | 4.001546350 | 4.016702621 | 0.3930469 |
| 1.3% | 4.041110000 | 4.012540000 | 4.026533586 | 0.3620090 |
| 1.5% | 4.024829438 | 3.995753892 | 4.009995094 | 0.3699342 |
| 2.5% | 4.042490000 | 4.006210000 | 4.023979944 | 0.4599937 |

As shown in Table 2, if the percentage of the ratio of the number of Y atoms to the total number of atoms is greater than 0 and equal to or less than 1.5%, the in-plane strain is effectively reduced compared to the film in which Y is not doped. In particular, when Y is 1.3%, the in-plane strain is reduced by 28% compared to the film in which Y is not doped.

Consequently, in the case where the dielectric film 5 is stoichiometric and the composition thereof can be expressed of Y atoms to the total number of atoms goes from 0.6% to 1.3%. The relative permittivity is slightly reduced in the film with 2.5% doped Y. Thus, it can be appreciated that doping of Y is effective in increasing the relative permittivity.

Figure 3:
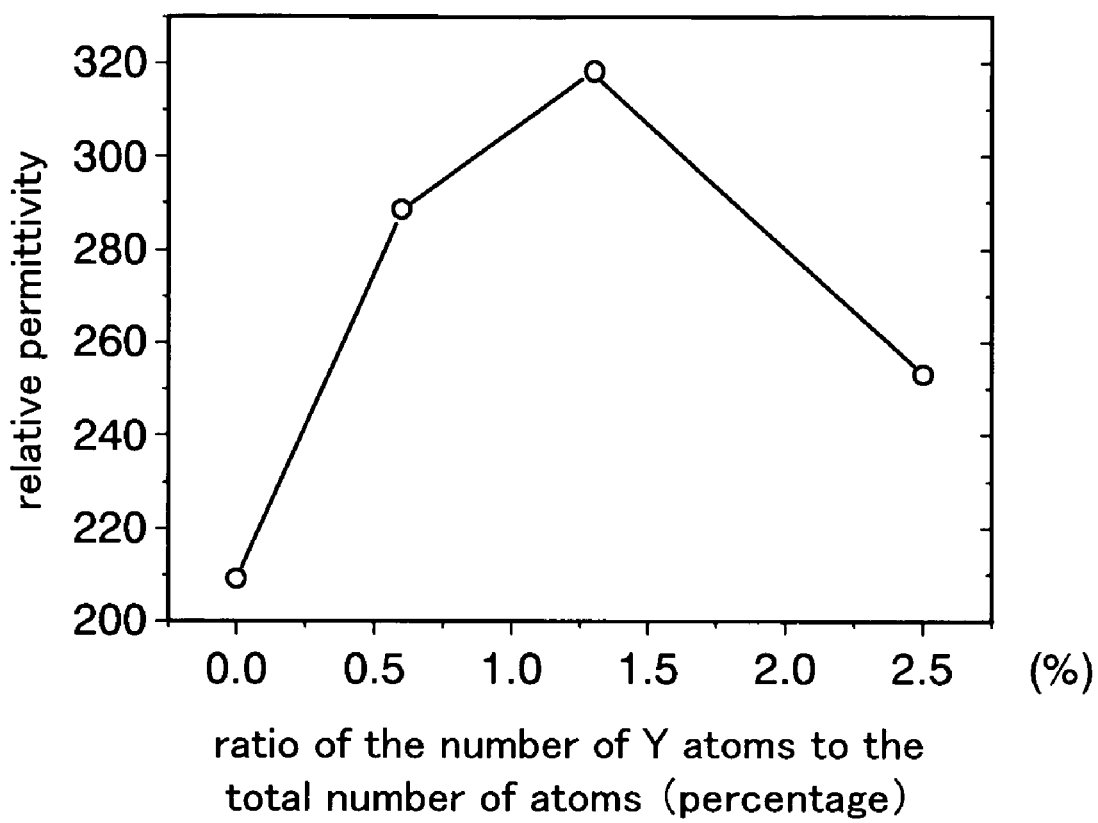
FIG. 3 is a graph obtained by investigating how the permittivity of the $(Ba_{0.63},Sr_{0.37})_{1-x} Y_{x+z} Ti_{1-z} O_3$ film changes depending on the ratio of the number of Y atoms to the total number of atoms in the first embodiment of the present invention.

FIG. 3 is a graph obtained by investigating how the permittivity of the $(Ba_{0.63}Sr_{0.37})_{1−x}Y_{x+z}Ti_{1−z}O_3$ film changes depending on the ratio of the number of Y atoms to the total number of atoms "$(X+Z)/2$"

As shown in FIG. 3, the film in which Y is not doped (0%) also shows the lowest relative permittivity. The relative permittivity increases as the ratio of the number of Y atoms to the total number of atoms becomes larger so long as the percentage thereof is in a range of 0 to 1.5%. If the percentage thereof is greater than 1.5%, the relative permittivity starts to decline.

As can be seen from the result shown in FIG. 3, it is preferable to make the ratio of the number of Y atoms to the total number of atoms greater than 0 and equal to or less than 0.015 for increasing the relative permittivity of the $(Ba_{0.63}Sr_{0.37})_{1-x}Y_{X+Z}Ti_{1-z}O_3$ film as in the case of reducing the in-plane strain (FIG. 2).

Figure 4:
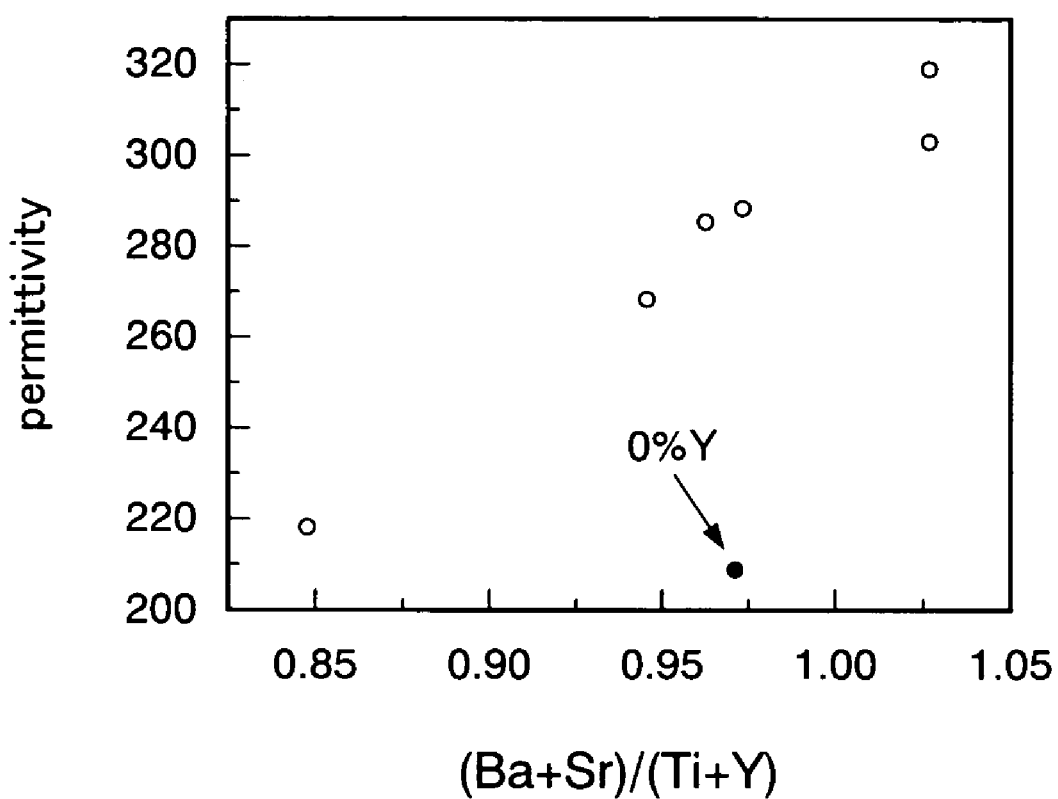
FIG. 4 is a graph obtained by investigating how the permittivity of the $(Ba_{0.63},Sr_{0.37})_{1-x} Y_{x+z} Ti_{1-z} O_3$ film changes depending on $(Ba+Sr)/(Ti+Y)(=(1-X)/(1+X))$, which represents the ratio of Ba+Sr atoms to Ti+Y atoms, in the first embodiment of the present invention.

FIG. 4 is a graph obtained by forming the $(Ba_{0.63}Sr_{0.37})_{1-x}Y_{X+Z}Ti_{1-z}O_3$ film as the dielectric film 5 and investigating how the permittivity of the film changes depending on $(Ba+Sr)/(Ti+Y)(=(1-X)/(1+X))$, which is the ratio of Ba+Sr atoms to Ti+Y atoms.

As shown in FIG. 4, the permittivity is increased in a region where $(Ba+Sr)/(Ti+Y)$ is greater than 0.85, i.e., $x<0.08$.

In addition, it can be appreciated that the permittivity is further increased effectively in a region where $(Ba+Sr)/(Ti+Y)$ is greater than 0.95, i.e., $x<0.03$.

Here, in the case where the dielectric film 5 is not stoichiometric and the composition thereof can be expressed as $(Ba_{1-y},Sr_y)_m Y_p Ti_q O_{3+\delta}$, the above-described condition is identical to $0.85<m/(p+Q)$, and to $0.95<m/(p+Q)$ for more preferable case.

Figure 5:
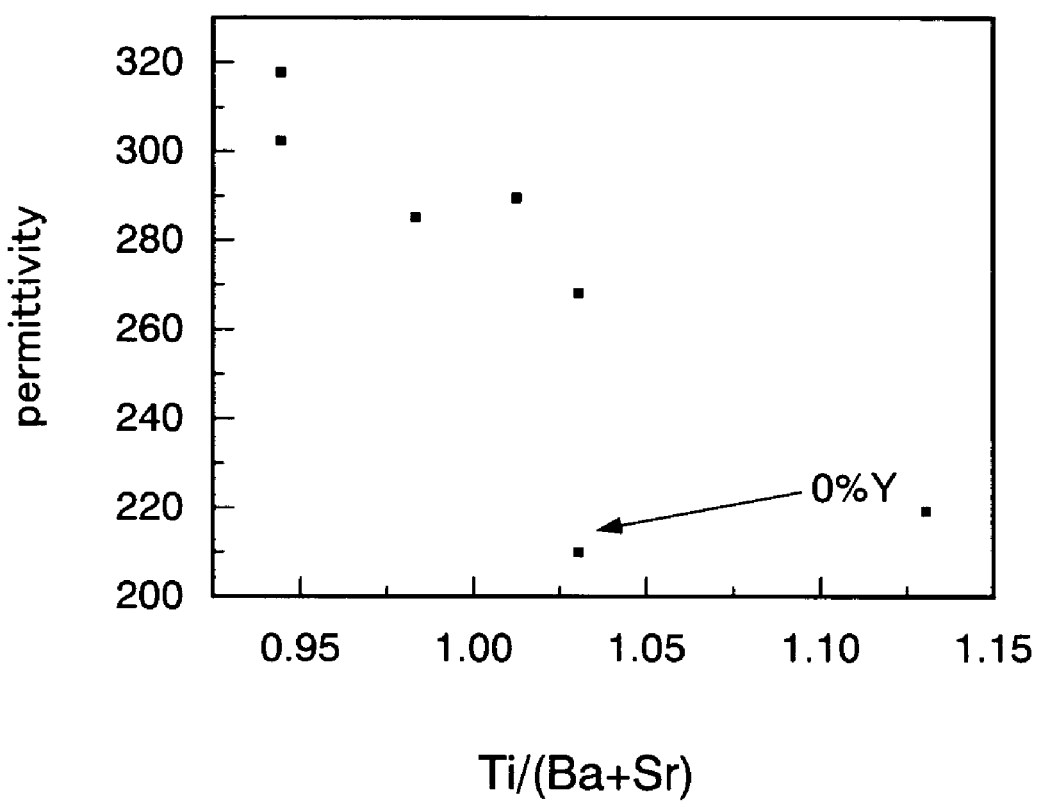
FIG. 5 is a graph obtained by investigating how the permittivity of the $(Ba_{0.63},Sr_{0.37})_{1-x} Y_{x+z} Ti_{1-z} O_3$ film changes depending on $Ti/(Ba+Sr)(=(1-z)/(1-x))$, which represents the ratio of Ti atoms to Ba+Sr atoms, in the first embodiment of the present invention.

FIG. 5 is a graph obtained by forming the $(Ba_{0.63}Sr_{0.37})_{1-x}Y_{X+Z}Ti_{1-z}O_3$ film as the dielectric film 5 and investigating how the permittivity of the film changes depending on $Ti/(Ba+Sr)(=(1-z)/(1-x))$, which is the ratio of Ti atoms to Ba+Sr atoms. Here, in the case where the dielectric film 5 is not stoichiometric and the composition thereof can be expressed as $(Ba_{1-y},Sr_y)_m Y_p Ti_q O_{3+\delta}$, $Ti/(Ba+Sr)$ is equivalent to $Q/m$.

As shown in FIG. 5, the permittivity is increased in a region where $Ti/(Ba+Sr)$ is greater than 0.9 and less than 1. When the dielectric film 5 is not stoichiometric, this condition is equivalent to $0.9<Q/m<1$.

Figure 6:
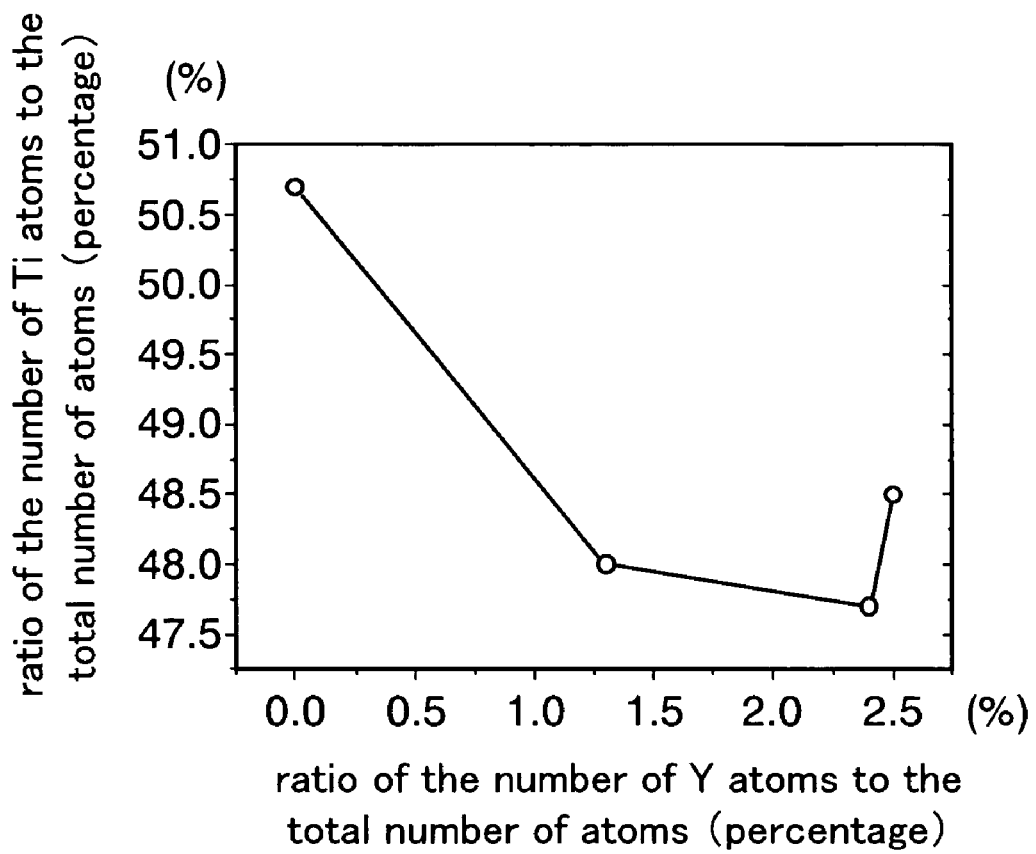
FIG. 6 is a graph obtained by changing the ratio of the number of Y atoms to the total number of atoms in the $(Ba_{0.63},Sr_{0.37})_{1-x} Y_{x+z} Ti_{1-z} O_3$ film and investigating how this influences the variation in the ratio of the number of Ti atoms to the total number of atoms in the first embodiment of the present invention.

FIG. 6 is a graph obtained by changing the ratio of the number of Y atoms to the total number of atoms "$(X+Z)/2$" in the $(Ba_{0.63}Sr_{0.37})_{1-x}Y_{X+Z}Ti_{1-z}O_3$ film and investigating how this change influences on the change in the ratio of Ti atoms to the total number of atoms "$(1-z)/2$".

As shown in FIG. 6, when the ratio of the number of Y atoms to the total number of atoms is greater than 0 and equal to or less than 0.015, the ratio of Ti atoms to the total number of atoms is greater than 0.48 and less than 0.505.

Here, in the case where the dielectric film 5 is not stoichiometric and the composition thereof can be expressed as $(Ba_{1-y},Sr_y)_m Y_p Ti_q O_{3+\delta}$, the above-described ratio of Ti atoms to the total number of atoms is expressed as $Q/(m+p+Q)$. Accordingly, the above-described condition is identical to $0.48<Q/(m+p+Q)<0.505$.

Figure 7:
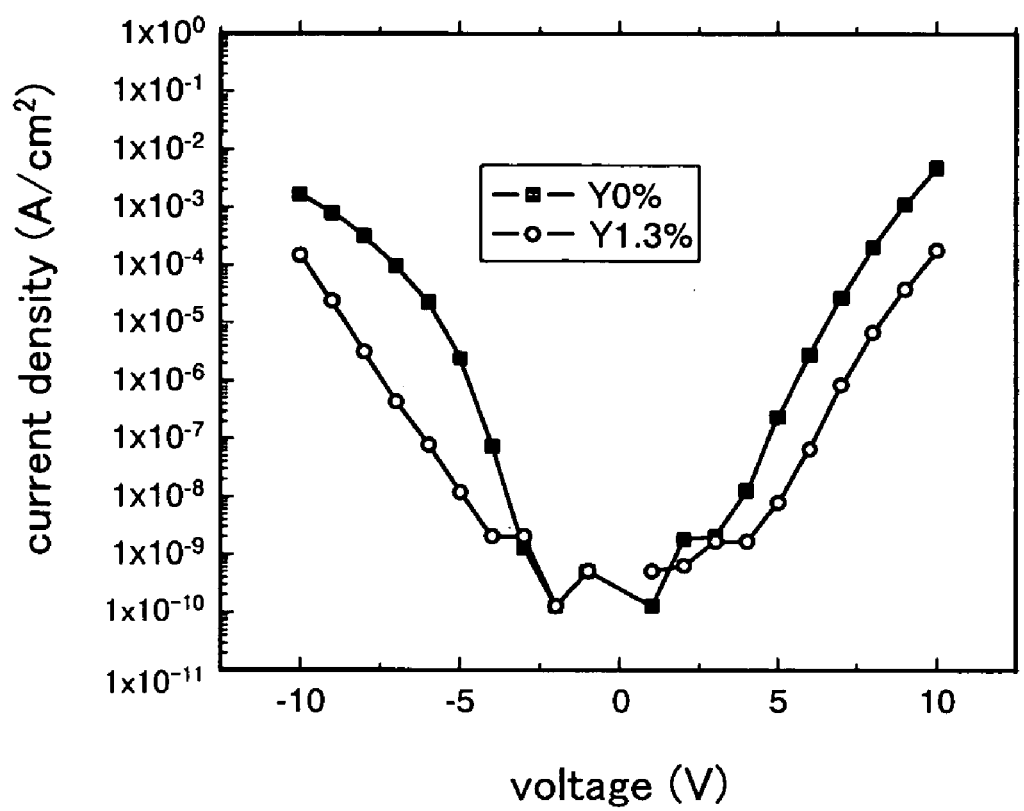
FIG. 7 is a graph obtained by measuring leak current densities of the two $(Ba_{0.63},Sr_{0.37})_{1-x} Y_{x+z} Ti_{1-z} O_3$ films having the percentages of the ratios of Y atoms 0% and 1.3% respectively, in the first embodiment of the present invention.

FIG. 7 is a graph obtained by measuring the leak current densities of the two $(Ba_{0.63}Sr_{0.37})_{1-x}Y_{X+Z}Ti_{1-z}O_3$ films having the percentages of the ratios of the number of Y atoms to the total number of atoms 0% and 1.3%, respectively. In FIG. 7, the horizontal axis represents voltage applied to the film, and the longitudinal axis represents the leak current density.

As shown in FIG. 7, by setting the percentage of the ratio of the number of Y atoms to the total number of atoms to 1.3%, the leak current density can be reduced compared to the film in which Y is not doped (0%). As can be seen from this result, setting the ratio of the number of Y atoms to the total number of atoms in the $(Ba_{0.63}Sr_{0.37})_{1-x}Y_{X+Z}Ti_{1-z}O_3$ film to greater than 0 is effective in reducing the leak current.

According to the above-described present embodiment, Y is doped in the capacitor dielectric film 5a constituting the capacitor Q, and the ratio of the number of Y atoms to the total number of atoms in this film is set to greater than 0 and equal to or less than 0.015. In the case where the dielectric film 5a is stoichiometric and the composition thereof can be expressed as $(Ba_{0.63},Sr_{0.37})_{1-x}Y_{x+z}Ti_{1-z}O_3$, the above-described condition is equivalent to $0<(X+Z)/2\leq0.015$, i.e. $0<(X+Z)\leq0.03$. In addition, in the case where the dielectric film 5a is not stoichiometric and the composition thereof can be expressed as $(Ba_{1-y},Sr_y)_m Y_p Ti_Q O_{3+\delta}$, the above-described condition is identical to $0<p/(p+m+Q)\leq0.015$.

As apparent from the above-described findings, reduction in the in-plane strain, increase in the relative permittivity and reduction in leak current can be achieved all at the same time by employing the above-described ratio of the number of Y atoms to the total number of atoms, and thereby the reliability of the capacitor Q can be increased.

In addition, in the present embodiment, it is only necessary to set the ratio of the number of Y atoms to the total number of atoms in the $(Ba_{0.63},Sr_{0.37})_{1-x}Y_{x+z}Ti_{1-z}O_3$ film to be greater than 0 and less than 0.015. Accordingly, the method for depositing this film is not limited to epitaxial growth as in Patent Document 2, and a non-epitaxial growth method using deposition methods such as sputtering method, CVD method and sol-gel method can be employed to deposit the dielectric film 5. Thus, it is possible to increase the flexibility in selecting available processes compared to the case of Patent Document 2.

Moreover, as can be seen from the findings in FIG. 4, it is possible to increase the permittivity of the capacitor dielectric film by setting $(Ba+Sr)/(Ti+Y)$ greater than 0.85.

Alternatively, as can be seen from the findings in FIG. 5, it is also possible to increase the permittivity of the capacitor dielectric film by setting $Ti/(Ba+Sr)$ greater than 0.9 and less than 1.

Further, although Patent Document 1 discloses in its FIG. 9 the permittivity of a dielectric film obtained by doping Y in BST, Patent Document 1 does not find out the fact that the permittivity depends on the doping amount of Y. Still further, Patent Document 1 does not find out the fact that the reduction in the in-plane strain, increase in the relative permittivity and reduction in leak current are all compatible and achieved at the same time.

Furthermore, in the present embodiment, cations such as $Fe^{+3}$ and $Al^{+3}$ are doped in the dielectric film 5. Accordingly, the relative permittivity of the dielectric film 5 can be increased by 60% or more as compared to the dielectric film 5 in which these cations are not doped. In this way, high capacitance density can be achieved for the capacitor Q.

(2) Second Embodiment

Figure 8A:
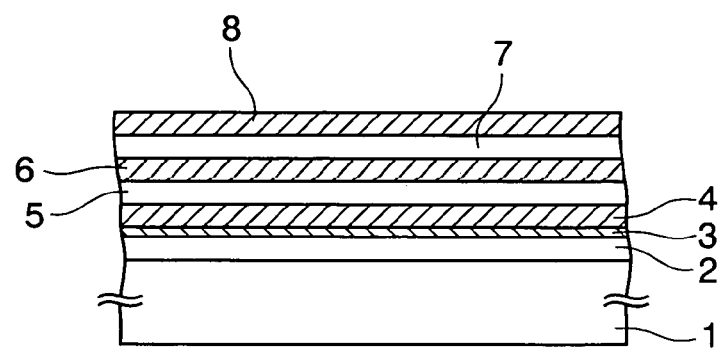
FIG. 8A and FIG. 8B are cross-sectional views each showing a capacitive element according to a second embodiment of the present invention in course of manufacture.
Figure 8B:
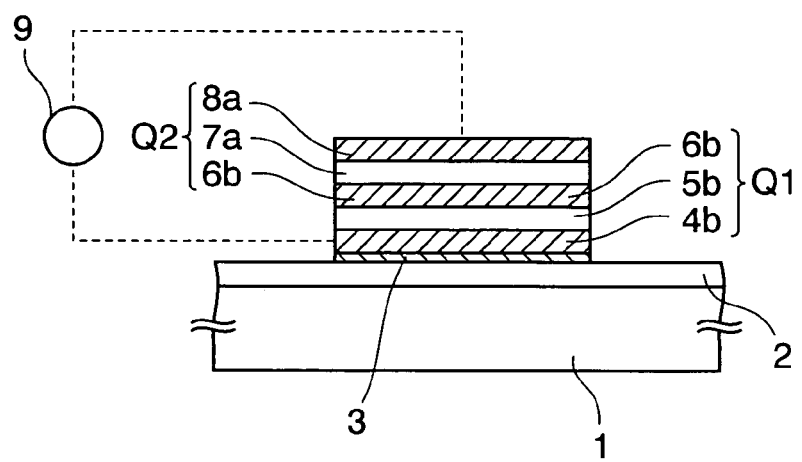

FIG. 8A and FIG. 8B are cross-sectional views each showing a capacitive element according to a second embodiment of the present invention in course of manufacture.

First, the cross-sectional structure of the capacitive element, which is shown in FIG. 1D, is obtained in accordance with the above-described first embodiment. Thereafter, as shown in FIG. 8A, a $(Ba_{0.63}Sr_{0.37})_{1.015}Y_{0.026}Ti_{0.960}O_3$ film having a thickness of about 1 to 10000 nm is formed using sputtering method. The formed film is used as a second dielectric film 7. As for the condition for depositing the second dielectric film 7, it is possible to employ, for example, the condition used for depositing the dielectric film 5 in the first embodiment. Therefore, a detailed description thereof is omitted.

Subsequently, a Pt film having a thickness of about 100 nm is formed on the second dielectric film 7 using sputtering method. The Pt film is used as a third conductive film 8.

Next, as shown in FIG. 8B, the first conductive film 4, the dielectric film 5, the second dielectric film 6, the second dielectric film 7 and the third dielectric film 8 are patterned through photolithography process. In this way, the first conductive film 4, the dielectric film 5 and the second dielectric film 6 are formed into a bottom electrode 4b, a first capacitive dielectric 5b and an intermediate electrode 6, respectively, thereby constituting a first capacitor Q1. Meanwhile, the second dielectric film 7 and the third dielectric film 8 are formed into a second capacitor dielectric film 7a and a top electrode 8a, respectively. The second capacitor dielectric film 7a, the top electrode 8a and the intermediate electrode 9b constitute a second capacitor Q2.

The first capacitor Q1 and the second capacitor Q2 share the intermediate electrode 6b, and a power supply 9 as shown in the drawing is connected to the bottom electrode 4b and the top electrode 8a. By doing this, a structure can be obtained in which the capacitors Q1 and Q2 are connected in series.

According to the structure thus obtained, the composite capacitance density of the capacitors Q1 and Q2 becomes lower than the capacitance density in the case where the capacitors Q1 and Q2 are provided independently. For this reason, capacitors with this structure can be applied to LSI and the like, which requires the capacitance density to be reduced.

In addition, the second dielectric film 7a is composed of the $(Ba_{0.63}Sr_{0.37})_{1.015}Y_{0.026}Ti_{0.960}O_3$ film, and the ratio of the number of Y atoms to the total number of atoms is set to 0.013, which resides in the range of 0 to 0.015. Accordingly, reduction in in-plane strain, increase in relative permittivity and reduction in leak current can be achieved all at the same time for the second capacitor dielectric film 7a, and reliability of the capacitor Q2 can be increased.

(3) Third Embodiment

Next, a description will be given of a capacitive element according to a third embodiment of the present invention.

FIG. 9A to FIG. 9D are cross-sectional views each showing the capacitive element according to the third embodiment of the present invention in course of manufacture.

This capacitive element is mounted on a wiring substrate together with a semiconductor element such as LSI, and serves as a decoupling capacitor which absorbs power line variation in LSI and the like.

Figure 9A:
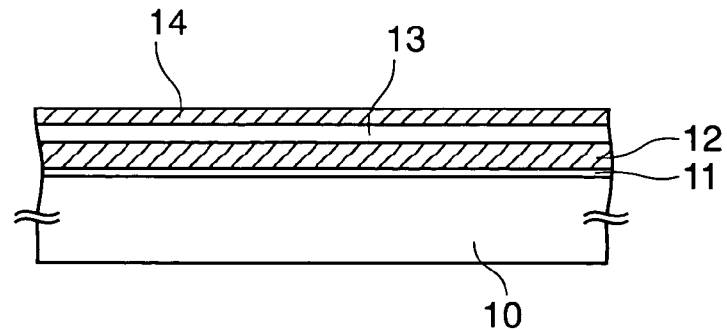
FIG. 9A to FIG. 9D are cross-sectional views each showing a capacitive element according to a third embodiment of the present invention in course of manufacture.

First, a description will be given for processes through which the cross-sectional structure of the capacitive element shown in FIG. 9A is obtained.

First, a silicon dioxide ($SiO_2$) film having a thickness of about 500 nm is formed on a substrate 10 such as a silicon substrate using CVD (Chemical Vapor Deposition) method employing silane as a reaction gas. The formed film is used as a base insulating film 11.

Subsequently, as a bottom electrode film 12, a Pt film having a thickness of about 80 nm is formed on the base insulating film 11 using sputtering method.

The $(Ba_{0.63}Sr_{0.37})_{1.015}Y_{0.026}Ti_{0.960}O_3$ film having a thickness of about 80 nm is formed on the bottom electrode film 12 using sputtering method employing the same condition as used for depositing the dielectric film 5 of the first embodiment. The formed film is used as a dielectric film 13.

Thereafter, as a conductive film 14, the Pt film having a thickness of about 80 nm is formed on the dielectric film 13 using sputtering method.

Figure 9B:
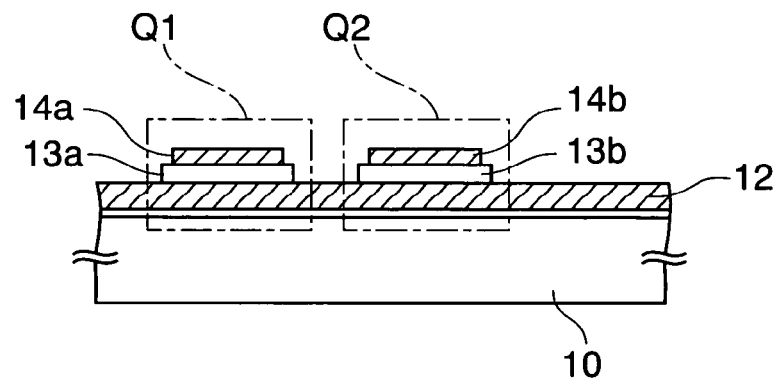

Next, as shown in FIG. 9B, the conductive film 14 is patterned through photolithography process to form first and second top electrodes 14a and 14b, each of which is island-shaped. Thereafter, the dielectric film 13 is further patterned through photolithography process to form first and second capacitor dielectric films 13a and 13b under the top electrodes 14a and 14b, respectively. Thus, a capacitor Q1 composed of the bottom electrode film 12, the first capacitor dielectric film 13a and the first top electrode 14a, and a capacitor Q2 composed of the bottom electrode film 12, the second capacitor dielectric film 13b and the second top electrode 14b, are formed on the substrate 10.

Figure 9C:
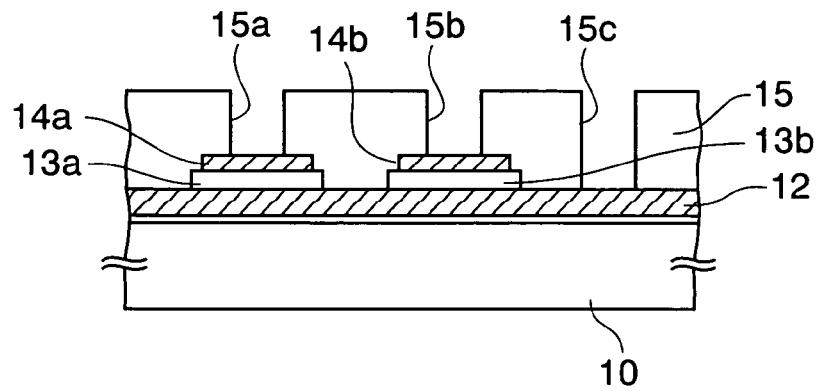

Next, as shown in FIG. 9c, the entire surface of the substrate 10 is spin coated with a insulative resin such as a polyimide, and the resin is heat-cured to form an insulative passivating layer 15 having a thickness of about 100 nm. The insulative passivating layer 15 is then patterned through photolithography process to form first and second holes 15a and 15b, which reach the top electrodes 14a and 14b respectively, as well as a third hole 15c reaching an area of the bottom electrode film 12, where the top electrodes 14a and 14b are not formed.

Figure 9D:
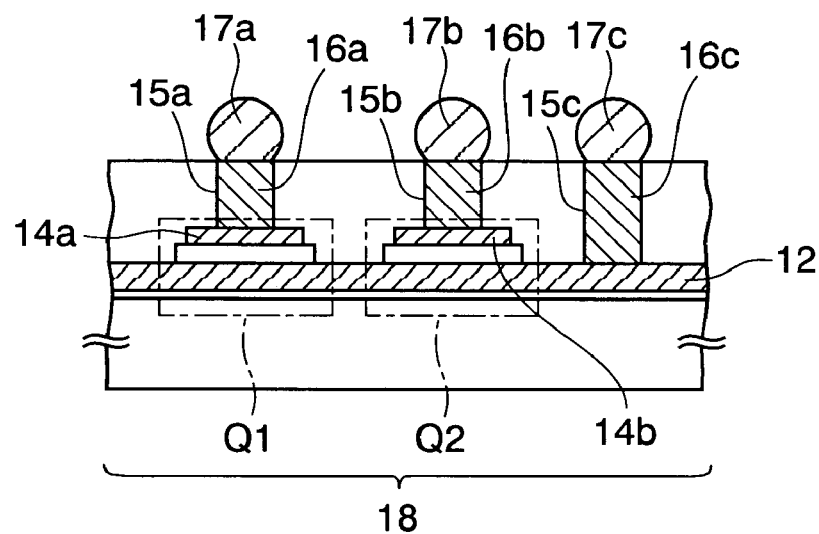

Subsequently, as shown in FIG. 9D, Ti/Cu/Ni, for example, is filled in the holes 15a to 15c. In this way, first and second conductive plugs 16a and 16b, which are connected electrically to the top electrodes 14a and 14b, respectively, are formed in the first and second holes 15a and 15b, respectively. A third conductive film 16c connected electrically to the bottom electrode film 12 is also formed in the third hole 15c. Ti constituting these conductive plugs 16a to 16c is formed by use of sputtering. Cu and Ni are formed by use of electrolytic plating.

First to third solder bumps 17a to 17c, each of which functions as an external connection terminal, are mounted on the upper surfaces of the conductive plugs 16a to 16c, respectively. The solder bumps 17a to 17c are melted under reflow atmosphere and thereby connected to the respective conductive plugs 16a top 16c electrically and mechanically.

Thus, the basic structure of a capacitive element 18 according to the present embodiment is finished.

Figure 10:
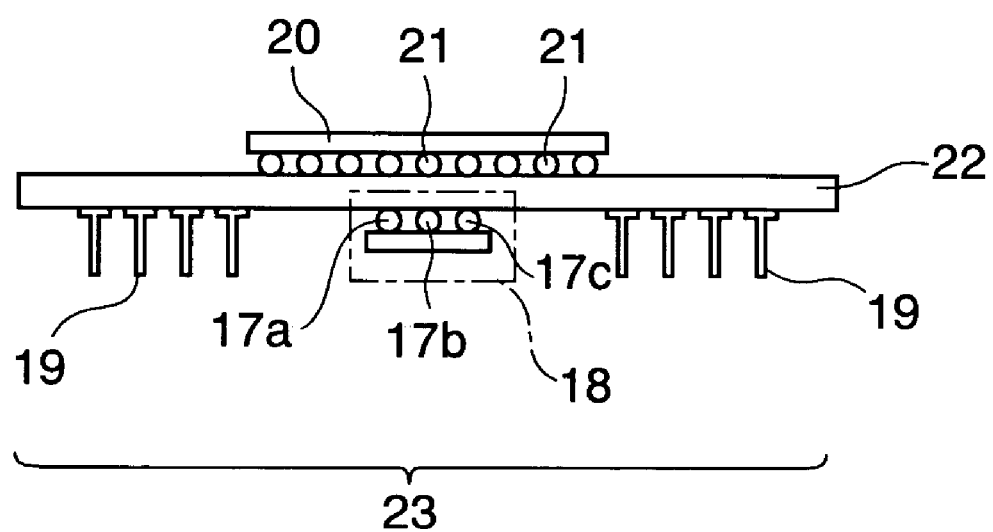
FIG. 10 is a cross-sectional view of a semiconductor package in which the capacitive element according to a third embodiment of the present invention is mounted together with a semiconductor element.

The application purpose of the capacitance element 18 is not limited. As shown in FIG. 10, it is preferable to mount the capacitance element 18 on a wiring substrate 22 together with a semiconductor element 20 such as LSI, and to use the capacitors Q1 and Q2 as decoupling capacitors which absorb switching noises and power line variation in the semiconductor element 20.

In the example shown in FIG. 10, the capacitive element 18 is electrically and mechanically connected to the wiring substrate 22 via the first to third solder bumps 17a to 17c constituting the capacitance element 18. Similarly, the semiconductor element 20 is also electrically and mechanically connected to the wiring substrate 22 via solder bumps 21. The capacitance element 18, the wiring substrate 22 and the semiconductor element 20 then constitute a semiconductor package 23. A plurality of conductive pins 19, each constituting the external connection terminal of the semiconductor package 23, is provided to stand along the wiring substrate 22.

According to the present embodiment described above, as shown in FIG. 9D, the two capacitors Q1 and Q2 which constitute the capacitive element 18 are formed to share the bottom electrode film 12, thereby constituting a structure in which the two capacitors Q1 and Q2 are connected in parallel. Accordingly, the capacitance density of the capacitive element 18 becomes higher than in the case of forming only a single capacitor on the substrate 10. As a result, when the capacitors Q1 and Q2 are used as decoupling capacitors as shown in FIG. 10, it is possible for the capacitance element 18 to sufficiently absorb switching noises and power line variation in the semiconductor element 20, and thereby the reliability of the semiconductor package 23 can be increased.

(4) Fourth Embodiment

Next, a description will be given of a capacitive element according to a fourth embodiment of the present invention.

In the present embodiment, the dielectric film described in the first embodiment is used as a capacitor dielectric film for DRAM (Dynamic Random Access Memory).

FIG. 11A to FIG. 11I are cross-sectional views each showing a capacitive element according to the fourth embodiment of the present invention in course of manufacture.

Figure 11A:
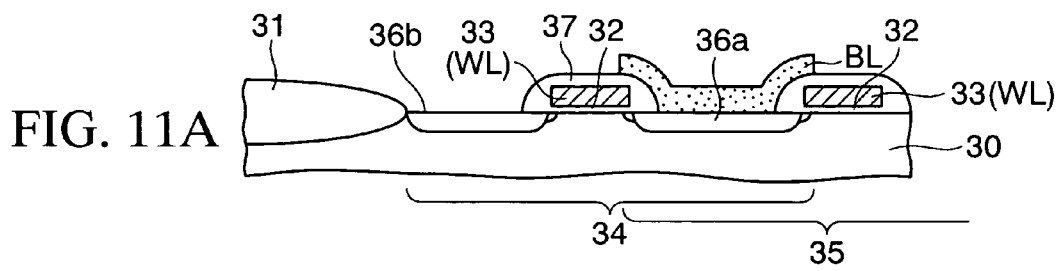
FIG. 11A to FIG. 11I are cross-sectional views each showing a capacitive element according to a fourth embodiment of the present invention in course of manufacture.
Figure 11B:
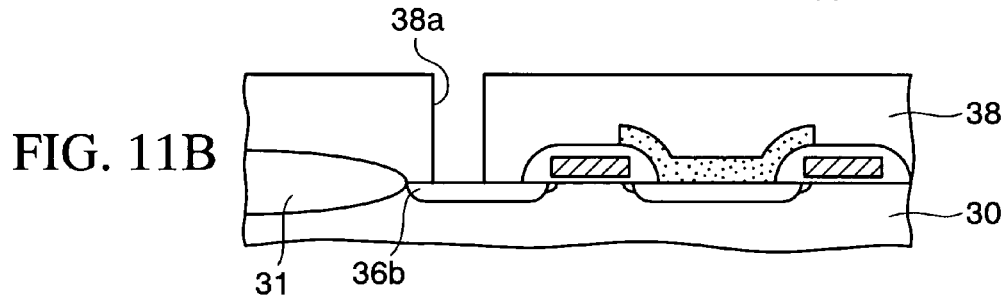

First, as shown in FIG. 11A, field oxide is formed around a transistor forming region on a surface of a silicon substrate 30 using LOCOS method. The formed film is used as a element isolation insulating film 31. Subsequently, gate electrodes 33 for MOS transistors 34 and 35 are formed on the transistor forming region via gate insulating layers 32. The gate electrodes 33 are extended on the element isolation insulating film 31 and serve as word lines (WL). First and second n-type impurity diffusion regions 36a and 36b, which constitute sources and drains of the MOS transistors 34 and 35, are formed on both sides of the gate electrodes 33. Among these impurity diffusion regions, the first n-type impurity diffusion region 36a is shared by the MOS transistors 34 and 35, and a bit line (BL) is connected to the first n-type impurity diffusion region 36a. Here, the gate electrodes 33 are covered with insulating layers 37 such as silicon dioxide.

Under such a condition, after covering the MOS transistors 34 and 35 and the element isolation insulating film 31 with a first interlayer insulation film such as silicon dioxide, a hole 38a is formed on an area of the first n-type impurity diffusion region 36b, where the bit lines (BL) from the MOS transistors 34 and 35 are not connected.

Figure 11C:
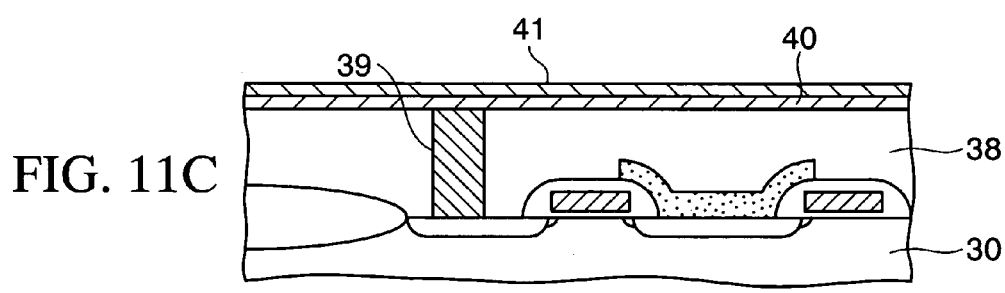

Thereafter, as shown in FIG. 11C, a conductive plug 39 made of either of tungsten or polysilicon is formed in the hole 38a. Using sputtering method, a titan (Ti) film 40 and a titan nitride (TiN) film 41 are subsequently formed both on the first interlayer insulation film 38 and the conductive plug 39 in this order. The titan (Ti) film 40 and the titan nitride (TiN) film 41 serve as barrier metals.

Figure 11D:
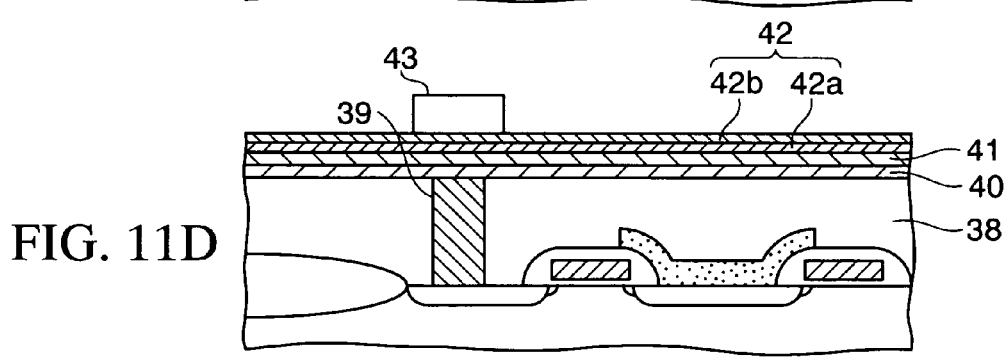

Next, as shown in FIG. 11D, a ruthenium (Ru) film 42a and a ruthenium oxide ($RuO_2$) film 42b are formed on the titan nitride film 41 in this order. The formed films are used as a first conductive filter 42. The thickness of the first conductive film 42 is about 100 nm, for example. Thereafter, a first resist pattern 43 having the shape of the bottom electrode is formed on the first conductive film 42.

Figure 11E:
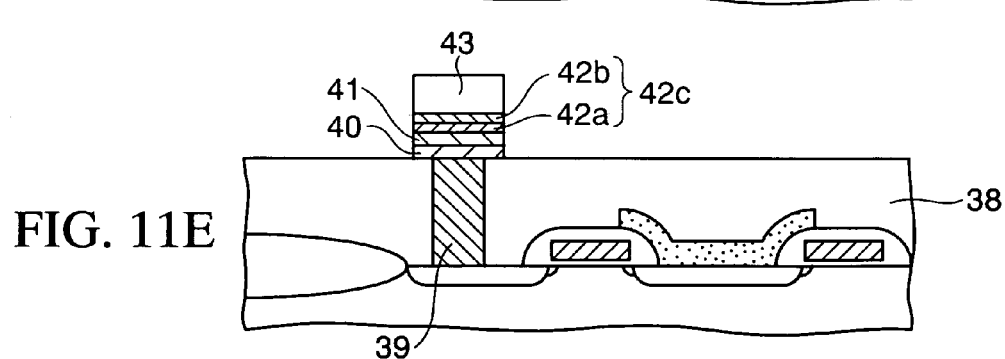

Subsequently, as shown in FIG. 11E, the first conductive film 42 is etched by use of ion-milling while using the first resist pattern as a mask. In this way, a bottom electrode 42c, which is composed of the ruthenium film 42a and the ruthenium oxide film 42b, is formed. In the ion-milling, the titan nitride film 41 and the titan film 40 are also etched. Thus, these films are left just beneath the bottom electrode 42c.

Thereafter, the first resist pattern 43 is removed.

Figure 11F:
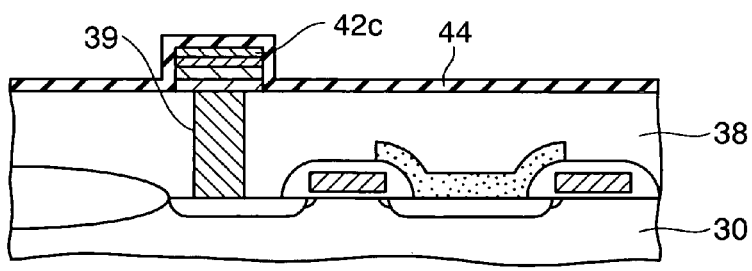

Next, as shown in FIG. 11F, a $(Ba_{0.63}Sr_{0.37})_{1.015}Y_{0.026}Ti_{0.960}O_3$ film having a thickness of 80 nm is formed both on the bottom electrode 42c and the first interlayer insulation film 38 using sputtering method employing the same condition as that used for depositing the dielectric film 5. The formed film is used as a dielectric film 44.

Figure 11G:
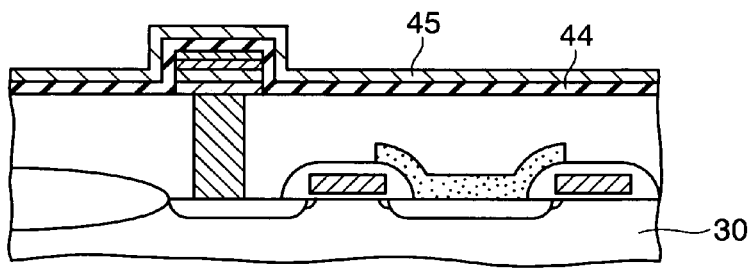

Next, as shown in FIG. 11G, the ruthenium film having a thickness of about 80 nm is formed on the dielectric film 44 using sputtering method. The formed film is used as a second conductive film 45. Here, the second conductive film 45 is not limited to the ruthenium film. The ruthenium oxide film, or a laminated film of the ruthenium oxide film and the ruthenium film may be formed as the second conductive film 45.

Figure 11H:
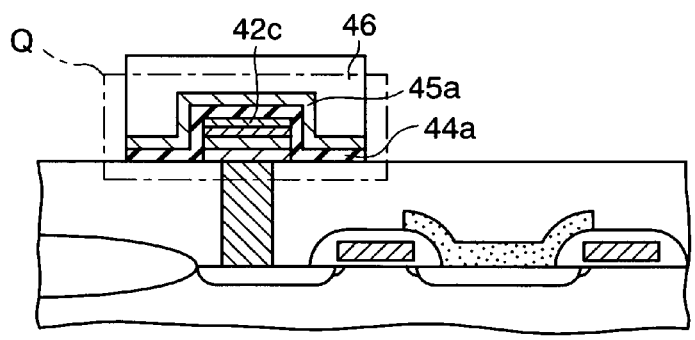

Subsequently, as shown in FIG. 11H, a second resist pattern 46 having the shape of the top electrode is formed on the second conductive film 45. The conductive film 45 and the dielectric film 44 are etched by use of ion-milling while using this second resist pattern 46 as a mask. In this way, a top electrode 45a having a larger area than that of the bottom electrode 42 and a capacitor dielectric film 44a are formed. This means that a capacitor Q constituted of the top electrode 45a and the capacitor dielectric film 44a is obtained.

Figure 11I:
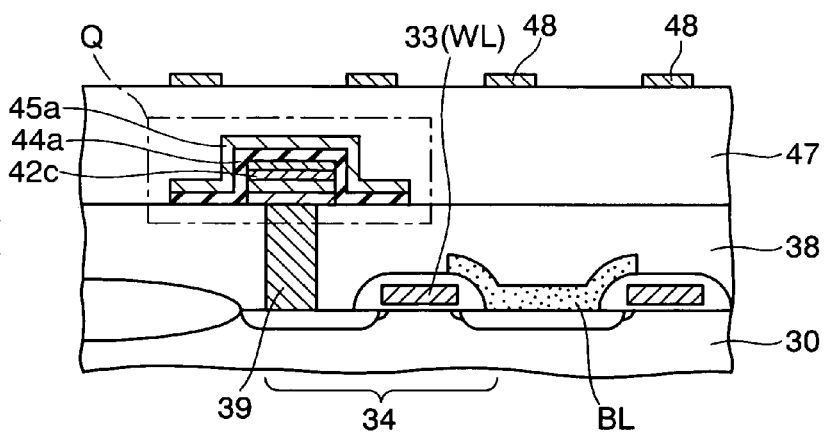

Next, as shown in FIG. 11I, a silicon dioxide ($SiO_2$) film having a thickness of about 200 nm is formed on the entire surface using plasma CVD method employing silane as a reaction gas. The formed film is used as a second interlayer insulation film 47. Thereafter, a metal film containing aluminum as a main component is formed on the second interlayer insulation film 47. Metal wirings 48 are formed by patterning this metal film.

Figure 12:
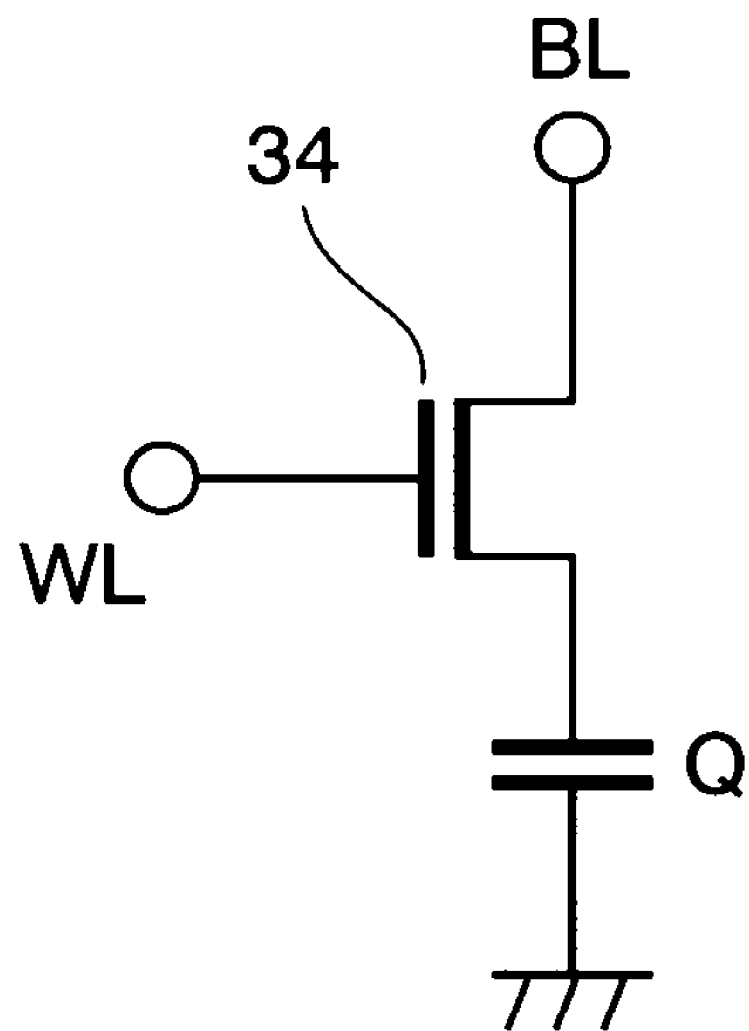
FIG. 12 shows an equivalent circuit of a memory cell for DRAM, in which the capacitive element according to the fourth embodiment of the present invention is used as a cell capacitor.

Thus, the basic structure of a memory cell of DRAM is finished. FIG. 12 shows an equivalent circuit of the memory cell.

According to the present embodiment described above, the capacitor dielectric film of the capacitor Q is composed of the $(Ba_{0.63}Sr_{0.37})_{1.015}Y_{0.026}Ti_{0.960}O_3$ film, and the ratio of the number of Y atoms to the total number of atoms is set to 0.013, remaining within the range of 0 to 0.015. Accordingly, reduction in in-plane strain, increase in relative permittivity and reduction in leak current can be achieved all at the same time for the second capacitor dielectric film 44a and the reliability of DRAM using the capacitor Q as a cell capacitor can be increased.

(5) Fifth Embodiment

Next, a description will be given of a capacitive element according to a fifth embodiment of the present invention.

The capacitor dielectric film 5a composed of $(Ba_{0.63}Sr_{0.37})_{1.015}Y_{0.026}Ti_{0.960}O_3$ described in the first embodiment may be applied to tunable capacitors.

Figure 13:
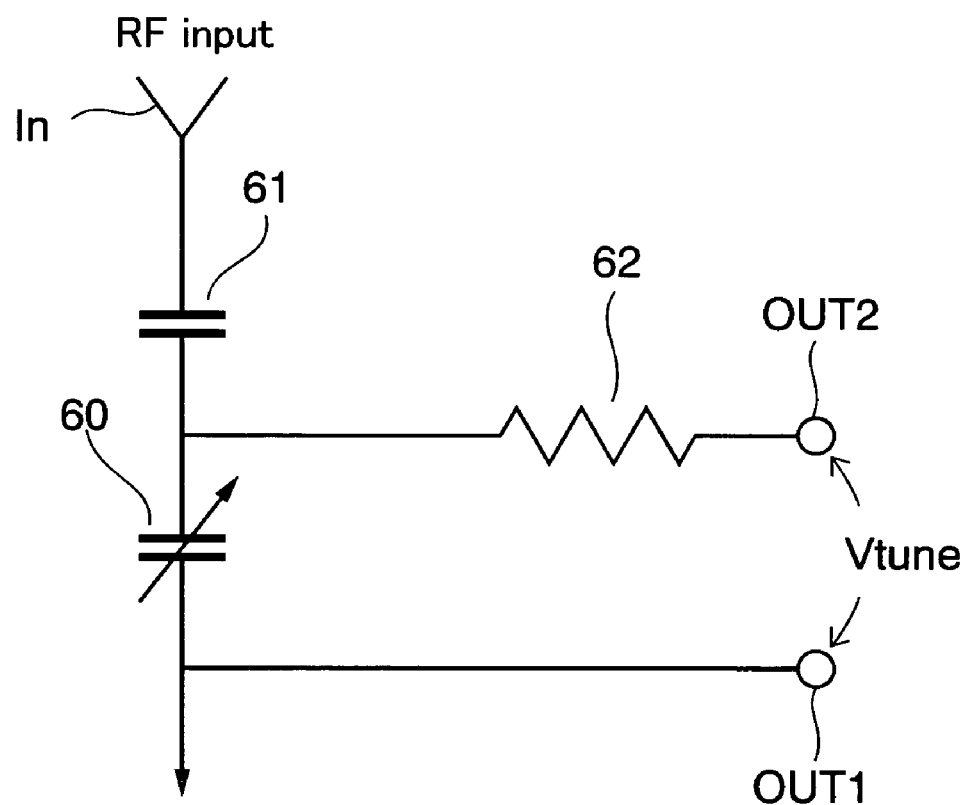
FIG. 13 is a schematic circuit diagram of a filter circuit using a tunable capacitor according to a fifth embodiment of the present invention as a tunable capacitance.

FIG. 13 is a schematic circuit diagram of a filter circuit using a tunable capacitor 60 employing such a capacitor dielectric film 5a.

The filter circuit includes the tunable capacitor 60 and a block capacitor 61, which are connected in series. A resistor 62 is connected to the connection point between these capacitors 60 and 61. A first output terminal OUT1 is connected to one terminal of the tunable capacitor 60, the terminal of which is one not connected to the block capacitor 61. The terminal of the resistor 62 on the opposite side of the capacitors 60 and 61 is a second output terminal OUT2.

In this filter circuit, when an input terminal connected to the block capacitor 61 receives an input of a RF (radiofrequency) signal, the direct-current component included in the signal is blocked by the block capacitor 61, and the RF signal free from the above-described direct-current component is applied across the tunable capacitor 60.

A resonator is constituted of the tunable capacitor 60 and the resistor 62. For this reason, among RF signals having various frequencies, only the signal having the resonance frequency defined by the capacitance density C of the tunable capacitor 60 and the resistor value R of the resister 62 is outputted from the output terminals OUT1 and OUT2 as an output voltage $V_{tune}$.

According to the present embodiment, the $(Ba_{0.63}Sr_{0.37})_{1.015}Y_{0.026}Ti_{0.960}O_3$ film described in the first embodiment is used as a capacitor dielectric film of the tunable capacitor 60. Since the ratio of the number of Y atoms to the total number of atoms is set to 0.013, remaining within the range of 0 to 0.015, reduction in in-plane strain, increase in relative permittivity and reduction in leak current can be all achieved at the same time as described above. Accordingly, electrical properties and the reliability of the filter circuit using this tunable capacitor 60 can be increased.

According to the present invention, a capacitor dielectric film is composed of a material with the formula $(Ba_{1-y}Sr_y)_m Y_p Ti_Q O_{3+\delta}$, where $0<p/(p+m+Q)\leq 0.015$, $-0.5<\delta<0.5$. Accordingly, reduction in in-plane strain, increase in relative permittivity and reduction in leak current can be achieved at the same time for the capacitor dielectric film, and thereby the reliability of a capacitor can be increased.

Moreover, since divalent or trivalent cation is doped in this capacitor dielectric film, the permittivity of the capacitor dielectric film is increased by 60% or above compared to the capacitor dielectric film in which these cations are not doped.

What is claimed is:

1. A capacitive element comprising:
   a base material;
   an insulating film formed on the base material; and
   a capacitor constituted by sequentially forming a bottom electrode, a capacitor dielectric film and a top electrode on the insulating film,
   wherein the capacitor dielectric film is composed of a material with the formula $(Ba_{1-y}Sr_y)_m Y_p Ti_Q O_{3+\delta}$, where $0<p/(p+m+Q)\leq 0.015$, $-0.5<\delta<0.5$.

2. The capacitive element according to claim 1, wherein the capacitor dielectric film is stoichiometrically expressed by the formula $(Ba_{1-y}Sr_y)_{1-y}Y_{x+z}Ti_{1-z}O_{3+\delta}$, where $0<(X+Z)/2\leq 0.015$.

3. The capacitive element according to claim 1, wherein the composition of the capacitor dielectric film satisfies the condition $0.85<m/(p+Q)$.

4. The capacitive element according to claim 1, wherein the composition of the capacitor dielectric film satisfies the condition $0.95<m/(p+Q)$.

5. The capacitive element according to claim 1, wherein the composition of the capacitor dielectric film satisfies the condition $0.9<Q/m<1$.

6. The capacitive element according to claim 1, wherein the composition of the capacitor dielectric film satisfies the condition $0.48<Q/(m+p+Q)<0.505$.

7. The capacitive element according to claim 1, wherein the in-plane strain of the capacitor dielectric film is less than 0.005.

8. The capacitive element according to claim 1, wherein the in-plane strain of the capacitor dielectric film is reduced by 10% or more as compared to a capacitor dielectric film in which Y is not doped.

9. The capacitive element according to claim 1, wherein divalent or trivalent cation is further doped in the capacitor dielectric element.

10. The capacitive element according to claim 9, wherein the cation is any one of aluminum ion, iron ion, manganese ion, nickel ion, cobalt ion, magnesium ion, lutetium ion, erbium ion, yttrium ion, holmium ion, dysprosium ion, gadolinium ion, thulium ion and scandium ion.

11. The capacitive element according to claim 1, wherein the capacitor dielectric film is non-epitaxially grown.

12. The capacitive element according to claim 1, wherein the insulating film is any one of a silicon oxide film, a silicon nitride film, a silicon oxide-nitride film, a metal-oxide film with high dielectric constant, a xerogel film and a composite film in which two or more of these films are combined.

13. The capacitive element according to claim 1, wherein the base material is a single crystal semiconductor substrate composed of any one of silicon, germanium, silicon-germanium (SiGe), gallium arsenide (GaAs), indium arsenide (InAs) and indium phosphide (InP).

14. The capacitive element according to claim 1, wherein an adhesion layer is formed on the insulating layer, and
the bottom electrode is formed on the adhesion layer.

15. The capacitive element according to claim 1, wherein the adhesive layer is any one of a monolayer film and a laminated film, each of which is composed of any one of platinum, iridium, zirconium, titanium, titanium oxide, iridium oxide, platinum oxide, zirconium oxide, titanium nitride, titanium aluminum nitride (TiAlN), tantalum oxide, tantalum silicon nitride (TaSiN) and an alloy of any of these materials.

16. The capacitive element according to claim 1, wherein the bottom electrode is any one of a monolayer film and a laminated film, each of which is composed of any one of platinum, palladium, iridium, ruthenium, rhodium, osmium, gold, silver, copper, platinum oxide, iridium oxide, ruthenium oxide and an alloy of any of these materials.

17. The capacitive element according to claim 1, wherein the top electrode is any one of a monolayer film and a laminated film, each of which is composed of any one of platinum, palladium, iridium, ruthenium, rhodium, osmium, gold, silver, copper, platinum oxide, iridium oxide, ruthenium oxide, strontium ruthenium oxide ($SrRuO_3$), lanthanum nickel oxide ($LaNiO_3$) and an alloy of any of these materials.

18. The capacitive element according to claim 1, further comprising:
a passivating layer covering the capacitor.

19. The capacitive element according to claim 1, wherein the number of the capacitors which are formed is two, and
the capacitors are connected in series.

20. The capacitive element according to claim 1, wherein the number of the capacitors which are formed is two, and
the capacitors are connected in parallel.

21. The capacitive element according to claim 1, wherein the capacitor is a decoupling capacitor.

22. The capacitive element according to claim 1, wherein the capacitor is a tunable capacitor for a filter circuit.

23. The capacitive element according to claim 1, wherein the capacitor is a cell capacitor for DRAM (Dynamic Random Access Memory).

24. A method of manufacturing a capacitive element, comprising:
   a step of forming an insulating film on a base material;
   a step of forming a first conductive film on the insulating film;
   a step of forming a dielectric film composed of a material with the formula $(Ba_{1-y},Sr_y)_m Y_p Ti_Q O_{3+\delta}$, where $0 < p/(p+m+Q) \leqq 0.015$, $-0.5 < \delta < 0.5$, on the first conductive film;
   a step of forming a second conductive film on the dielectric film; and
   a step of forming a capacitor constituted of a bottom electrode, a capacitor dielectric film and a top electrode, by patterning the first conductive film, the dielectric film and the second conductive film.

25. The method of manufacturing a capacitive element according to claim 24, wherein the step of forming the dielectric film is performed by forming the dielectric film using a deposition method employing non-epitaxial growth.

26. The method of manufacturing a capacitive element according to claim 25, wherein any one of sputtering method, CVD method and sol-gel method is employed as the deposition method employing non-epitaxial growth.

27. The method of manufacturing a capacitive element according to claim 24, further comprising:
   a step of annealing the dielectric film in an oxygen-containing atmosphere after the step of forming the dielectric film.

* * * * *